United States Patent [19]
Garvison et al.

[11] Patent Number: 6,111,189
[45] Date of Patent: Aug. 29, 2000

[54] PHOTOVOLTAIC MODULE FRAMING SYSTEM WITH INTEGRAL ELECTRICAL RACEWAYS

[75] Inventors: Paul Garvison, Harpers Ferry, W. Va.; Donald B. Warfield, Woodbine, Md.

[73] Assignee: BP Solarex, Frederick, Md.

[21] Appl. No.: 09/123,724

[22] Filed: Jul. 28, 1998

[51] Int. Cl.[7] .................... H01L 31/0203; H01L 31/048; H01L 31/05; E04D 13/18

[52] U.S. Cl. .................... 136/244; 136/251; 136/259; 53/173.3; 126/621

[58] Field of Search .................... 136/244, 251, 136/259, 246, 260, 261; 53/173.3; 126/621, 622

[56] References Cited

U.S. PATENT DOCUMENTS

| | | | |
|---|---|---|---|
| 4,040,867 | 8/1977 | Forestieri et al. | 136/89 |
| 4,057,439 | 11/1977 | Lindmayer | 136/89 |
| 4,064,521 | 12/1977 | Carlson | 357/2 |
| 4,093,473 | 6/1978 | Lindmayer | 136/89 |
| 4,139,399 | 2/1979 | Lindmayer | 136/89 |
| 4,142,195 | 2/1979 | Carlson et al. | 357/15 |
| 4,163,677 | 8/1979 | Carlson et al. | 136/89 |
| 4,167,015 | 9/1979 | Hanak | 357/16 |
| 4,189,881 | 2/1980 | Hawley | 52/220 |
| 4,200,473 | 4/1980 | Carlson | 136/89 |
| 4,256,681 | 3/1981 | Lindmayer | 264/85 |
| 4,317,844 | 3/1982 | Carlson | 427/39 |
| 4,330,582 | 5/1982 | Lindmayer | 428/64 |
| 4,339,470 | 7/1982 | Carlson | 427/39 |
| 4,392,009 | 7/1983 | Napoli | 136/251 |
| 4,433,200 | 2/1984 | Jester et al. | 136/251 |
| 4,532,371 | 7/1985 | Hanak et al. | 136/249 |
| 4,582,953 | 4/1986 | Nagase et al. | 136/259 |
| 4,636,578 | 1/1987 | Feinberg | 136/251 |
| 4,690,830 | 9/1987 | Dickson et al. | 427/38 |
| 4,692,557 | 9/1987 | Samuelson et al. | 136/251 |
| 4,718,947 | 1/1988 | Arya | 136/258 |
| 4,724,010 | 2/1988 | Okaniwa et al. | 136/246 |
| 4,755,231 | 7/1988 | Kurland et al. | 136/244 |
| 4,847,669 | 7/1989 | Yamazaki et al. | 357/30 |

(List continued on next page.)

OTHER PUBLICATIONS

"Performance and Long–Term Reliability of Multijunction Amorphous Silicon Photovoltaic Modules", by D.E. Carlson, R.R. Arya, and R. Romero, published by International Semiconductors. Device Research Symposium, Dec. 10–13, 1997.

"Commercialization of Multijunction Amorphous Silicon Modules" by D.E. Carlson, R.R. Arya, M. Benett, L.F. Chen, K.. Jansen, Y.M. Li, Newton, K. Rajan, R. Romero, D. Talenti, E. Twesme, F. Willing and L. Yang at Solarex, a Business Unit of Amoco/Enron Solar, Newtown, PA, presented at 25th IEEE PVSC, May 13–17, 1996.

German App. No. P 38 01 090.0 Filed: Jan. 16, 1998, German Pub. No. DE 30 01 090 A1, Pub: Jun. 1, 1988.

German App. No. P 41 40 682.6, Filed; Dec. 10, 1991, German Pub. No. DE 41 40 682 A1, Pub: Jun. 17, 1993.

German App. P 28 18 474.9, Filed: Apr. 27, 1978, German Pub. No. DE 28 18 474 A1, Pub: Oct. 31, 1979.

German App. No. P 44 33 769.8, Filed: Aug. 22, 1994, German Pub. No. DE 4433 769 A1, Pub. No.: Mar. 28, 1996.

*Primary Examiner*—Nam Nguyen
*Assistant Examiner*—Michael C. Miggins
*Attorney, Agent, or Firm*—Welsh & Katz, Ltd.; Thomas W. Tolpin

[57] ABSTRACT

A multi-purpose photovoltaic module framing system is provided which combines and integrates the framing system with the photovoltaic electrical system. The user friendly framing system is easy to install and can be directly mounted to a roof surface without auxiliary brackets and beams. The economical framing system has aesthetically pleasing frames to mechanically hold and support photovoltaic modules. The multi-purpose frames desirably have integral electrical raceways which conceal and protect most electrical components and wires. The reliable frames are specially constructed and arranged to permit easy access to output wires and do not require junction boxes. Ground clips can be directly connected to the convenient framing system.

19 Claims, 9 Drawing Sheets

U.S. PATENT DOCUMENTS

| | | | |
|---|---|---|---|
| 5,110,369 | 5/1992 | Tornstrom et al. | 136/251 |
| 5,112,409 | 5/1992 | Warfield et al. | 136/256 |
| 5,125,608 | 6/1992 | McMaster et al. | 248/163.1 |
| 5,164,020 | 11/1992 | Wagner et al. | 136/251 |
| 5,232,518 | 8/1993 | Nath et al. | 136/251 |
| 5,246,506 | 9/1993 | Arya et al. | 136/249 |
| 5,256,887 | 10/1993 | Yang | 257/53 |
| 5,338,369 | 8/1994 | Rawlings | 136/246 |
| 5,403,404 | 4/1995 | Arya et al. | 136/249 |
| 5,409,549 | 4/1995 | Mori | 136/244 |
| 5,476,553 | 12/1995 | Hanoka et al. | 136/251 |
| 5,524,401 | 6/1996 | Ishikawa et al. | 52/173.3 |
| 5,578,142 | 11/1996 | Hattori et al. | 136/251 |
| 5,589,006 | 12/1996 | Itoyama et al. | 136/248 |
| 5,590,495 | 1/1997 | Bressler et al. | 52/173.3 |
| 5,593,901 | 1/1997 | Oswald et al. | 437/2 |
| 5,646,050 | 7/1997 | Li et al. | 437/4 |
| 5,647,915 | 7/1997 | Zukerman | 136/251 |
| 5,684,325 | 11/1997 | Kataoka et al. | 257/433 |
| 5,730,808 | 3/1998 | Yang et al. | 136/249 |
| 5,787,653 | 8/1998 | Sakai et al. | 52/173.3 |

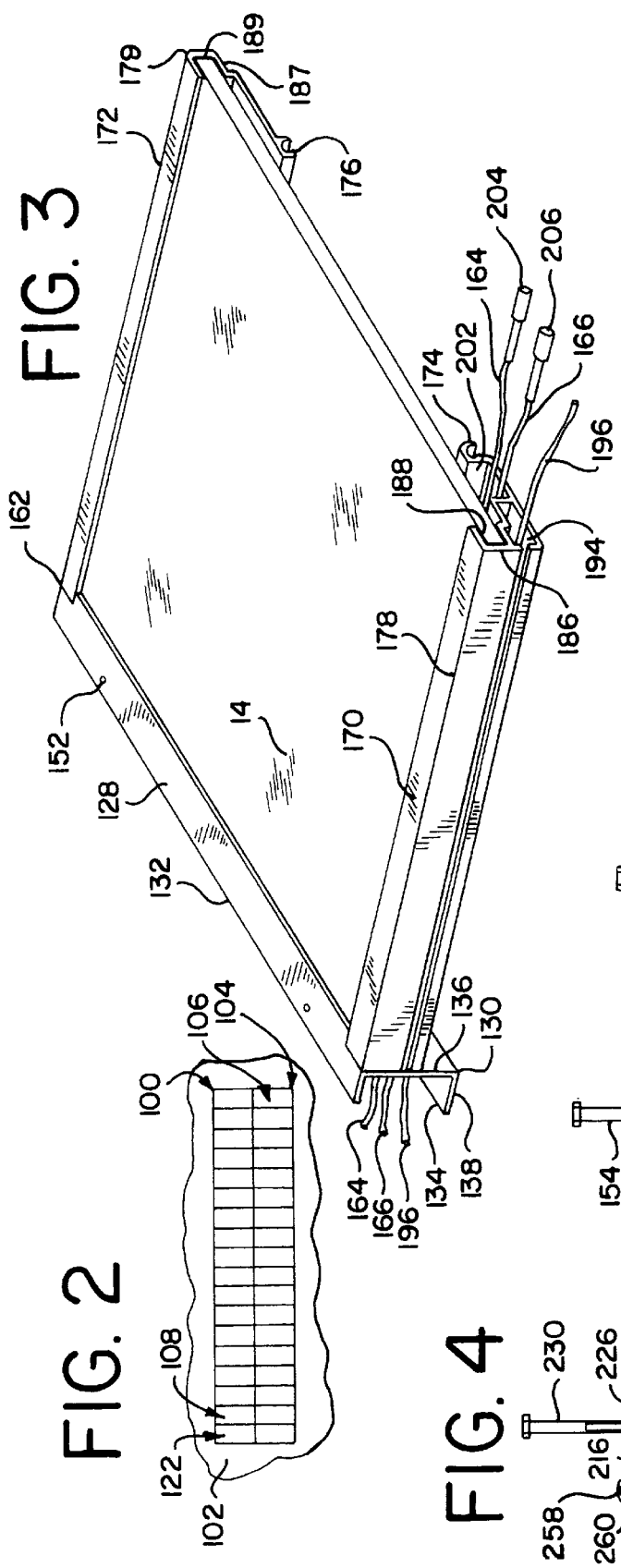

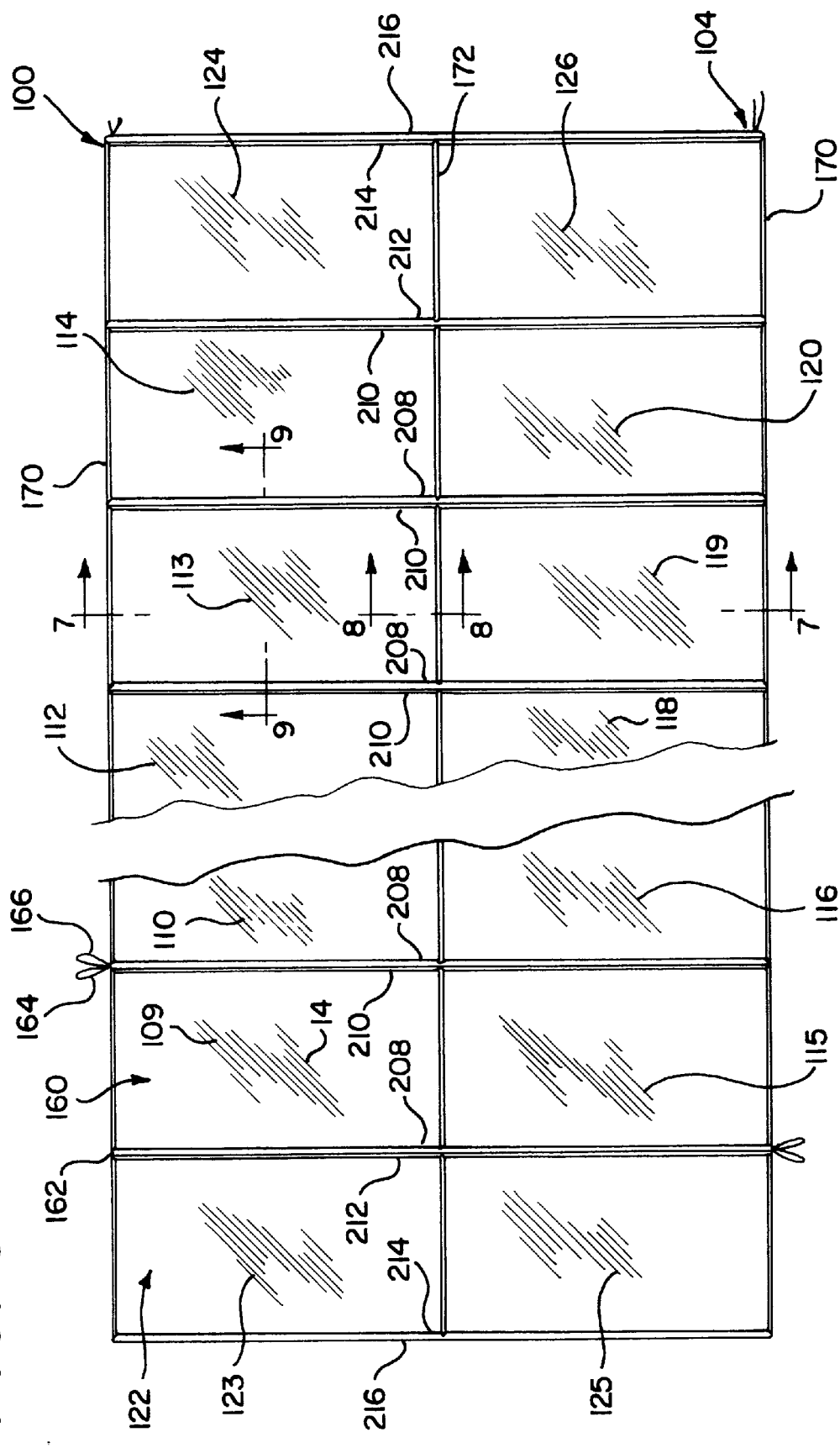

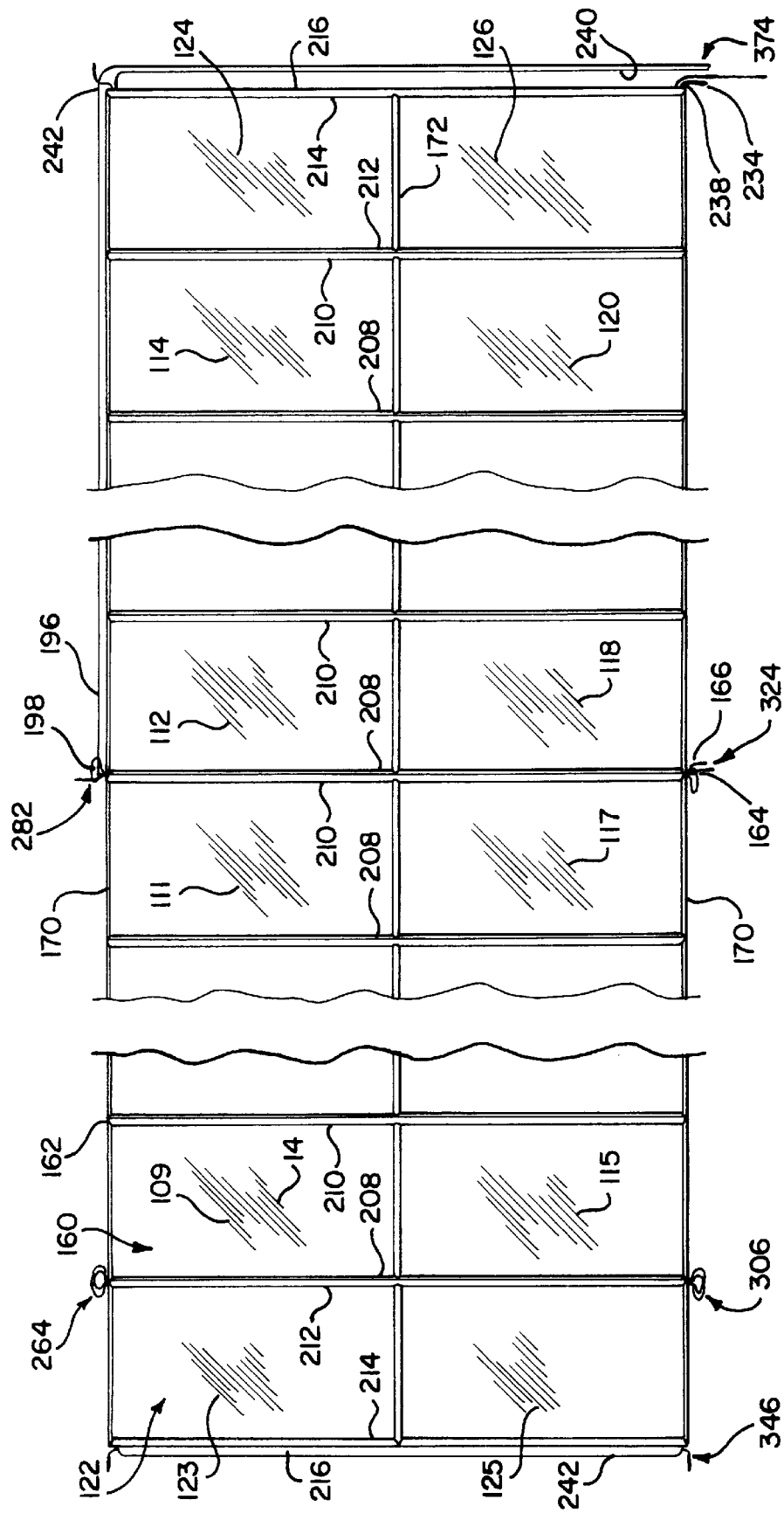

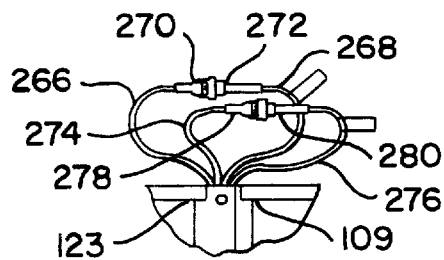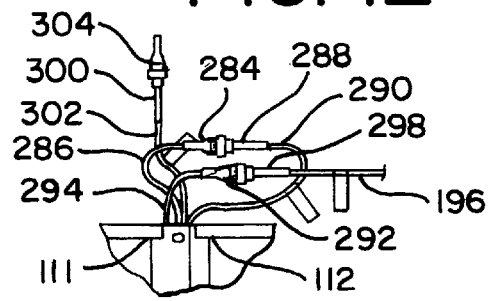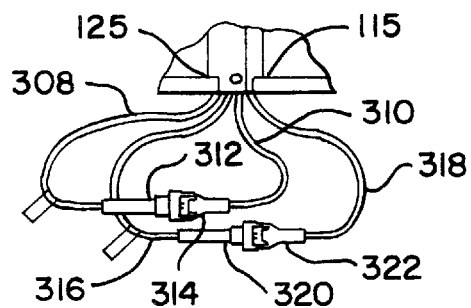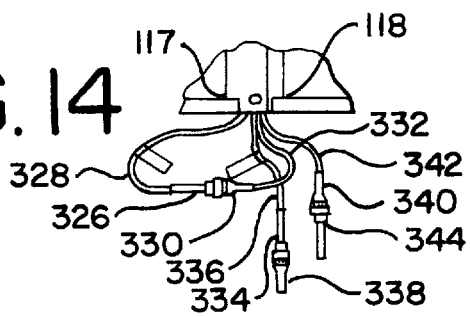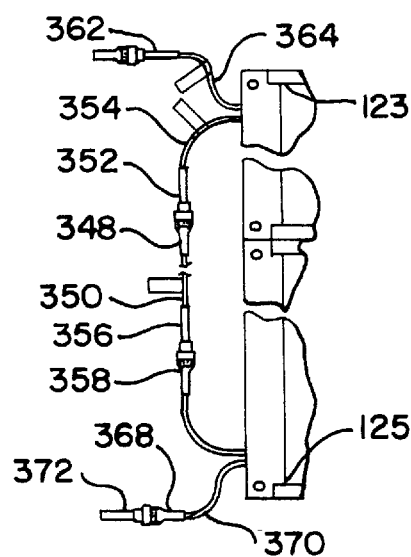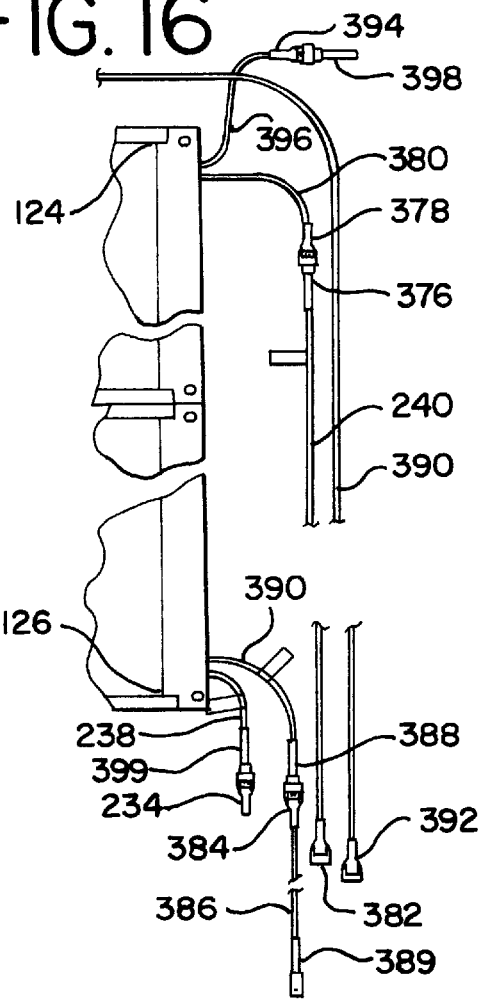

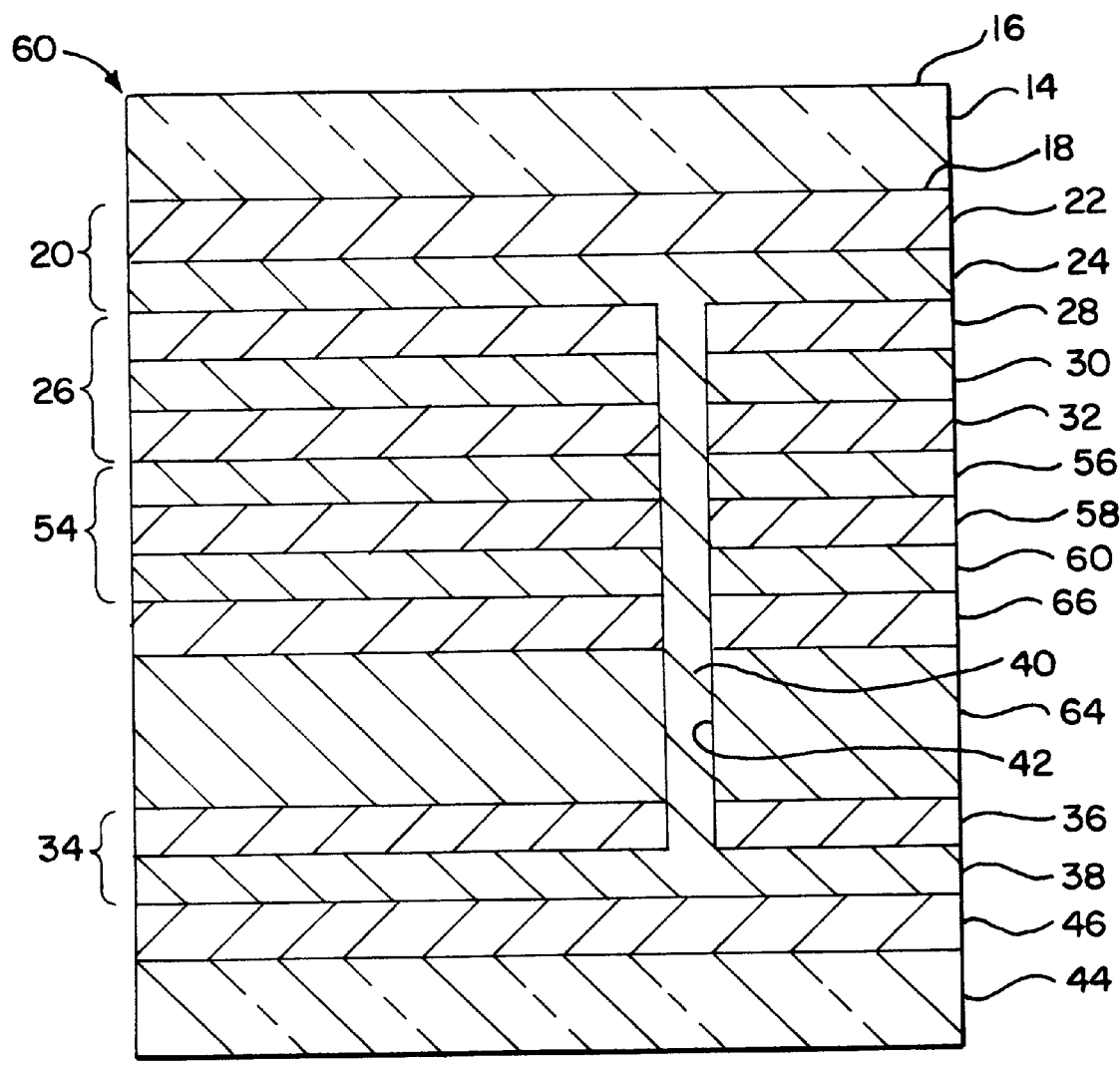

PHOTOVOLTAIC MODULE FRAMING SYSTEM WITH INTEGRAL ELECTRICAL RACEWAYS

BACKGROUND OF THE INVENTION

This invention pertains to solar cells and, more particularly, to a photovoltaic module framing system.

Conventional photovoltaic module framing systems use different frames to mechanically hold and mount the module to a support surface, such as a roof, or to a rack, and use a separate electrical system to electrically connect the photovoltaic modules. Most prior framing systems use an auxiliary bracket or beam to mechanically support and reinforce the framing system. This can be expensive, awkward, and ugly. Furthermore, conventional, photovoltaic electrical module framing systems usually require junction boxes and sometimes conduits which need to be attached to the framing system. Junction boxes are usually not aesthetically pleasing to consumers and are often not conveniently located. Furthermore, separate electrical ground conductors usually need to be connected to conventional photovoltaic systems, as well as expensive interconnection hardware.

Some prior framing systems have inwardly facing flanges with separate junction boxes. Inwardly facing flanges require that additional mounting fasteners be installed separately from the photovoltaic modules. This is an inconvenient process when attaching photovoltaic modules to a surface. In other prior framing systems, adjacent modules abut against each other and their plugs snap into sockets or other plugs in the sides of adjoining modules. As a result of thermal expansion, the plugs move in and out of electrical contact making bad contacts and sometimes cause electrical arcs across the modules which can start electrical fires. Furthermore, such an arrangement can corrode the plugs, cause system failures and result in unsatisfactory performance.

In order to install many conventional modules on a roof, the modules are commonly mounted to a larger frame, such as a structural rack, which is directly fastened to the roof on top of the shingles. Alternatively, the structural rack can be fitted into roofjacks and fastened to the roof on top of the shingles. There are many disadvantages to such prior conventional framing systems.

Photovoltaic modules which are manufactured using glass as a substrate or superstrate or as both surfaces have a high weight per unit area and are relatively fragile. Although large photovoltaic modules can be desirable, large modules are heavier, bulkier and more cumbersome. With four modules bolted to a structural frame in a sub-array, the sub-arrays are heavy and can require lifting equipment to elevate and position the four modules and frame on a roof.

The design and fabrication of the structural racks and roof jacks is usually left to the installer and can involve considerable labor and material cost. Commercially available, pre-made structural racks are also expensive. Positioning, assembling and fastening conventional modules to structural racks is labor intensive. It is also cumbersome to position and fasten the structural racks to the roof; or to lay out and fasten the roof jacks to the roof and the structural rack to the roof jacks. Clearances, gaps or spaces are often left between modules to permit the installer to place fasteners between the modules or sub-arrays. The appearance of some conventional module frames and spaces between modules and sub-arrays are regarded by many homeowners as aesthetically unpleasing on a finished roof. Such spaces also tend to collect leaves, twigs and other debris. The standard conventional picture frame-style or traditional external framing of the module can add considerable cost in material and labor to the finished photovoltaic module.

Roof-integrated installations have been tried by replacing certain portions of the roof construction with the photovoltaic modules themselves. This roof-integration effort has been attempted through approaches similar to glazing methods for skylights, but such methods have resulted in additional costs which are often higher than the amounts saved in replacing portions of the roof, therefore defeating their purpose.

Another drawback of roof-integrated photovoltaic module designs and conventional module framing systems is that they usually do not allow for the free flow of cooling air beneath the photovoltaic modules. Higher temperatures in the modules can result in lower power output and lower voltage from photovoltaic modules. In crystalline silicon cells, this temperature increase can decrease power output significantly and could lower the module voltage to a level which could not effectively charge batteries or produce the desired power in amorphous silicon cells. If a higher design voltage is chosen to ensure battery charging in hot weather for this reason, the result can be a loss of power for the module in spring, autumn and winter weather, due to a mismatch between battery voltage and optimum module voltage.

Some prior roof integrated module and system designs have attempted to cool the modules by utilizing glazing procedures to install the modules over roof framing members with the back surface of the modules open to an unheated attic space. This approach is not useful for insulated roofs. Furthermore, unheated attic spaces will have a much higher air temperature than the outside air, due to solar heat input from the roof, and because there is less air movement underneath the roof compared to the outside air. Fans can be used to help circulate air below the modules, but the use of fans is expensive and drain power.

It is, therefore, desirable to provide photovoltaic module framing system which overcome most, if not all, of the preceding problems.

SUMMARY OF THE INVENTION

An improved photovoltaic module framing systems is provided which is user friendly, easy to install and assemble, and economical. Advantageously, the reliable multi-purpose photovoltaic module framing system is aesthetically pleasing, conceals most electric components, and permits easy access to output wires. Desirably, the special photovoltaic module framing system combines and integrates the module framing system with the photovoltaic electrical system. Significantly, the improved photovoltaic module framing system does not require an electrical junction box or electrical conduits, nor does it require an auxiliary bracket, brace, or beam, as in bulky prior framing systems. Furthermore, the improved framing system does not use inwardly facing flanges of the type used in prior framing systems.

The novel photovoltaic framing system comprises an electrical wire-enclosing assembly to support, enclose and conceal a substantial portion of electrical wires in the photovoltaic module. Desirably, the electrical wire-enclosing assembly also comprises a frame positioned about the periphery of the photovoltaic module to mechanically hold the module. Significantly, the frame has at least one rail which receives fasteners to directly mount the photovoltaic module on or to a roof, wall, rack, beam, or other structure.

Preferably, the frame has portions to space the photovoltaic module above a roof, so as to form a gap therebetween to channel rain and water, as well as to provide an air passageway to cool the module.

In the preferred form, the frame has at least one electrical raceway and has a ground clip to electrically ground the electrical wire-enclosing assembly. The frame of the outboard module can have an outboard side rail which is covered by a removable outboard row closure. The outboard side rail and the outboard row closure cooperate with each other to define an electrical raceway therebetween to enclose, conceal and protect plugs (plug connectors), wires and output interconnections.

In another embodiment, the frame has a cavity which provides a compartment that is covered and enclosed by a detachable protective cover. The compartment and cover cooperate with each other to provide an electrical raceway which holds an electrical terminal block.

The preferred photovoltaic module framing system has at least one photovoltaic module with a laminate comprising a substrate, such as glass plate, at least one solar cell comprising photovoltaic semiconductors, and an encapsulating material (encapsulant) which partially encapsulates and seals the substrate and solar cell. Advantageously, a mechanical frame is provided to hold and directly mount the laminate adjacent to a roof surface, wall, rack, beam, or other structure. Desirably, the special frame has at least one integral electrical raceway which provides a channel, trough or slot to hold wires that are connected to the laminate. The multi-purpose frame can have: an external accessible electrical wire raceway, an internal electrical wire raceway, and/or multiple electrical raceways.

The solar cell can comprise: a single junction solar cell, a tandem solar cell, a triple junction solar cell, or other multi-junction solar cell. The solar cell can comprise a thin film solar cell with semiconductors comprising microcrystalline silicon, amorphous silicon, amorphous silicon carbon, amorphous silicon germanium, and/or cadmium telluride. The thin film solar cell can comprise an n-i-p solar cell, but preferably comprises a p-i-n solar cell. The solar cell can also comprise a crystalline wafer, either single crystal or polycrystalline, comprising silicon, copper indium diselinide (CIS), copper indium gallium diselinide (CIGS) or gallium arsenide.

A more detailed explanation of the invention is provided in the following description and appended claims taken in conjunction with the accompanying.

BRIEF DESCRIPTION OF THE DRAWINGS

FIG. 2 is a greatly reduced top plan view of an array of 36 photovoltaic modules;

FIG. 3 is an enlarged perspective view of a photovoltaic module showing a frame without the right overlapping side rail for ease of understanding and clarity;

FIG. 4 is an enlarged fragmentary exploded assembly view of the photovoltaic module framing system;

FIG. 5 is an fragmentary top plan view of the photovoltaic module framing system;

FIG. 10 is a fragmentary top plan view of the photovoltaic module framing system showing some of the electrical wires and circuit;

FIG. 11 is a front view of a typical parallel connection of the photovoltaic module framing system;

FIG. 12 is a front view of a series connection with a center tap of the photovoltaic module framing system;

FIG. 13 is a front view of another typical parallel connection of the photovoltaic module framing system;

FIG. 14 is a front view of a typical series connection of the photovoltaic module framing system;

FIG. 15 is a fragmentary front view of a typical series connection at the left side of the array of photovoltaic modules;

FIG. 16 is a fragmentary front view of a typical photovoltaic array output connection at the right side of the array of photovoltaic modules;

FIG. 23 is a cross-section view of a monolithic triple junction solar cell in accordance with principles of the present invention.

DETAILED DESCRIPTION OF THE PREFERRED EMBODIMENTS

Figure 1:
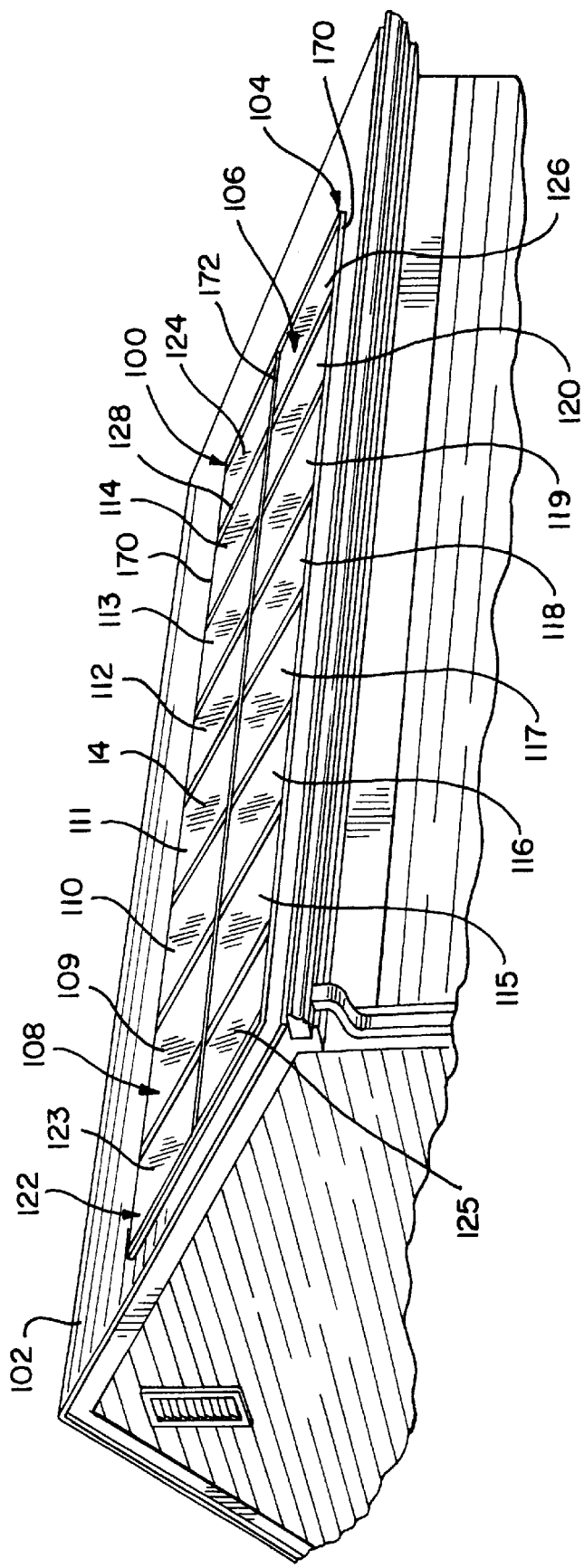
FIG. 1 is a perspective view of a photovoltaic module framing system directly mounted on a roof surface in accordance with principles of the present invention.

A multi-purpose(multiple purpose) photovoltaic module framing system 100 (FIG. 1) is provided which can be readily installed on an asphalt roof 102 or surface, as well as a wall, rack or beam. The photovoltaic module framing system preferably comprises an array 104 of photovoltaic modules 106. The photovoltaic modules can be comprised of intermediate photovoltaic modules 108, such as 109–114 and 115–120 positioned between and connected to outboard photovoltaic modules 122, such as 123 and 124 or 125 and 126. FIG. 1 illustrates an array of 16 modules. FIG. 2 illustrates an array of 36 modules. The array can also comprise 48 modules or 60 modules or some other number of modules in an orientation selected by the installer or customer.

Figure 9:
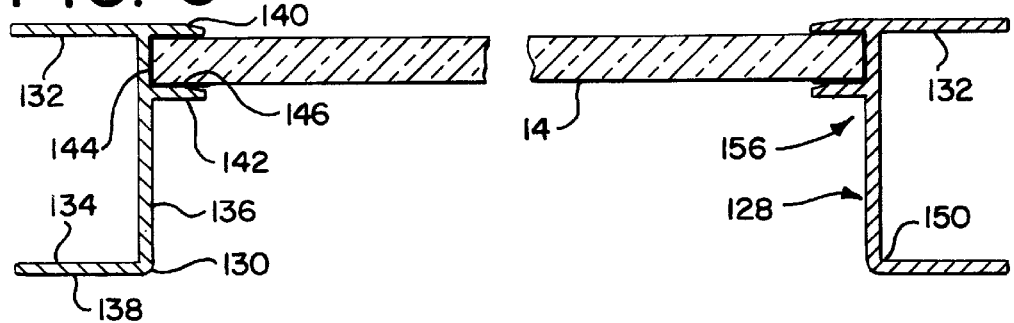
FIG. 9 is an enlarged fragmentary cross-sectional view of side rails taken substantially along lines 9—9 of FIG. 5.

Advantageously, the photovoltaic modules have overlapping interleaving side rails 128 (FIG. 1), between the intermediate photovoltaic modules, as well as between the intermediate photovoltaic modules and the outboard photovoltaic modules. As show in FIGS. 3, 4 and 9, the overlapping interleaving side rails can have a regular or inverted C-shaped or [-shaped (bracket shaped) cross-section 130 with: (a) overlapping upper side flanges 132, which extend laterally outwardly from upper portions of the modules, (b) overlapping lower side flanges 134, which provide feet that extend laterally outwardly from lower portions of the modules, and (c) an intermediate side bight 136 which provides a side crossbar that extends between and integrally connects the overlapping upper and lower side flanges. The bottom exterior surfaces 138 of the feet can abut against and engage the shingles of an asphalt roof. The overlapping side rails can also each have: (a) an upper inwardly-extending substrate-gripping side flange 140 (FIG. 9) which can be in coplanar lateral alignment and coplanar relationship with the overlapping upper side flange, and (b) an intermediate inwardly extending substrate-gripping side flange 142. The upper and lower substrate-gripping side flanges cooperate with each other to define a substrate-receiving side channel (side groove) 144 which receives a seal 146 made of butyl rubber or other flexible or resilient fluid impermeable material or water impervious material to hold, support and grip the side edges of the substrate 14, e.g. a glass plate. The overlapping lower side flange and lower portion of the crossbar below the intermediate substrate-gripping flange can provide a leg 150, which supports and elevates the substrate in the substrate-receiving channel (groove) above the roof or support surface. The overlapping upper side flanges and the overlapping lower side fanges can be substantially parallel and have substantially aligned bolt holes (mounting holes) 152 (FIG. 4) to receive hexagonal head stainless steel lag bolts 154 or other fasteners to securely connect and directly mount the photovoltaic modules above the roof so as to form an air gap 156 (FIG. 9) between the roof and the substrate (glass plate) of the modules. The air gap channels rain and water, helps prevent ice damming, and provides a passageway to dissipate heat emitted from the modules thus cooling the modules. The overlapping side rails define a thermal expansion side raceway 158 (FIG. 4) that provides a thermal gap between adjacent modules to accommodate thermal expansion of adjacent modules.

Each photovoltaic module comprises a laminate 160 (FIG. 5), a mechanical frame 162 to securely hold and support the laminate, and electrical wires, such as 164 and 166, which are connected to the laminate. The laminate comprises: a light-transmissive generally planar vitreous substrate 14, such as a plate of transparent glass or translucent glass with a rectangular periphery, at least one monolithic solar cell supported by the substrate, and an encapsulating material (encapsulant) to at least partially encapsulate and seal the substrate and the solar cell. The encapsulating material can be ethylene vinyl acetate (EVA) or Tedlar type plastic.

Figure 7:
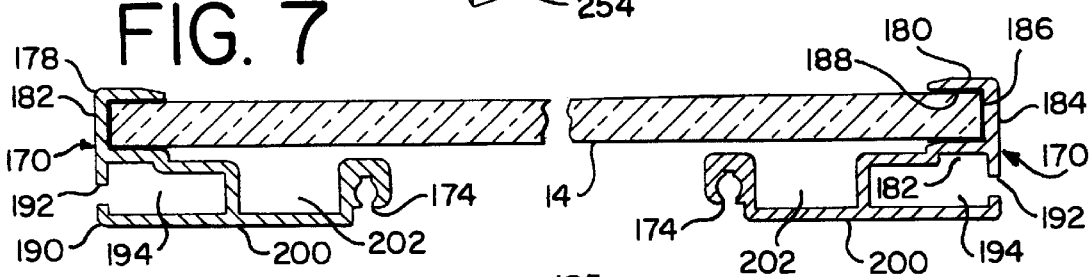
FIG. 7 is an enlarged fragmentary cross-sectional view of outboard end rails (end caps) with inboard and outboard electrical raceways, taken substantially along lines 7—7 of FIG. 5.

The frame comprises: (a) side rails and (b) outboard (outer or outwardly facing) end rails 170 (FIG. 1, 3, 5, and 7) and inboard (inner or inwardly facing) end rails 172 (FIGS. 1, 3, 5, and 8) which provide outer and inner end caps that extend between and are connected to the side rails by screws or other fasteners in the screw bosses 174 and 176 (screw holes) of the end caps. The outboard and inboard end caps have inner C-shaped or [-shaped (bracket shaped) cross-sections 178 and 179 with outboard (outer) flanges 180 (FIG. 7) and 181 (FIG. 8), inboard (inner) flanges 182 (FIG. 7) and 183 (FIG. 8), and crossbars (bights) 184 (FIG. 7) and 185 (FIG. 8) which extend between and connect the outboard and inboard flanges. The outboard and inboard end caps provide substrate-receiving end channels (end grooves) 186 and 187 (FIG. 3) which receive seal 188 and 189, respectively, made of butyl rubber or other flexible or resilient fluid impermeable material or water impervious material to hold, support and grip the end edges of the substrate, e.g. the glass plate. The side rails and end rails are fastened together to form a rectangular frame 162. The substrate-receiving grooves (channels) of the side rails and end rails of the frame, receive seals which engage and hold, support, and grip the peripheral edges of the glass plate (substrate).

The outboard end cap (outboard end rail) has an outer L-shaped flange 190 (FIG. 7) with an external access opening 192. The outer L-shaped flange is positioned outwardly of but extends further inwardly than the end flanges (substrate-receiving end channels). The L-shaped flange defines an outer external, partially enclosed electrical wire raceway 194 which provides an accessible outer channel and exterior wire trough and slot to hold, support and partially conceal and enclose interconnect wires (jumper cables) 196 (FIG. 3 and 10) that extend or run across several photovoltaic modules. Desirably, the wires are externally accessible in the outer external electrical wire raceway. The outer external electrical wire raceway can also hold, support, partially conceal and enclose plug connectors (plugs) such as 198 (FIG. 10). The plug connectors connect the wires. Advantageously the outer external electrical wire raceways allow for accessibility and placement of wires and plug connectors after mechanical installation and assembly of the photovoltaic modules without disconnecting or disassembling the frame of the photovoltaic module framing system.

An intermediate face (intermediate flange) 200 (FIG. 7) extends between and connects the outer face of the L-shaped flange of the outer external electrical wire raceway with the screw boss. The intermediate face is preferably in coplanar alignment with the outer face of the L-shaped flange. An inner internal electrical wire raceway 202 (FIGS. 3 and 7) is positioned between the outer external electrical wire raceway and the screw boss and is bounded by the inner side of the L-shaped flange and the screw boss. The inner internal electrical wire raceway provides an inner channel and interior wire trough and slot to hold, support, conceal and enclose the electrical wires, such as 164 and 166, connected to the modules, as well as the plug connectors (plugs), such as 204 and 206 (FIG. 3), connecting those wires.

The side rails of the photovoltaic modules are preferably identical or similar in size, shape, and structure for ease of manufacture, simpler installation, interchangeability of parts, and reduced costs. In some circumstances, it may be desirable that the side rails have different contours, shapes, or sizes, or that the side rails are symmetrical and complementary. The intermediate photovoltaic modules preferably have identical left and right inboard (inner or inwardly-facing) overlapping side rails 208 and 210 (FIGS. 4 and 5). The outboard (outer or outwardly facing) photovoltaic modules have inwardly-facing (inboard) overlapping side rails 212 and outboard (outer or outwardly-facing), side rails 214. The inboard overlapping side rails provide interior interleaving side rails. The outboard side rails are preferably identical in size, shape and structure to the inboard overlapping side rails and provide exterior side rails.

Figure 6:
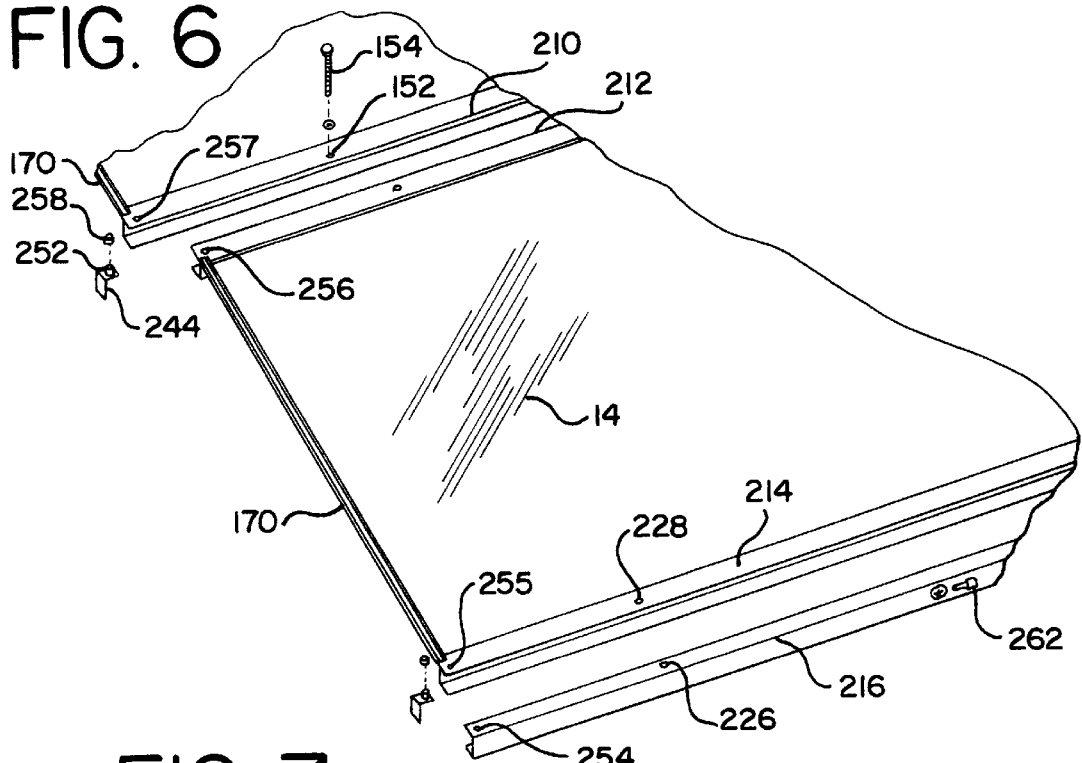
FIG. 6 is an fragmentary exploded assembly view of an outboard photovoltaic module and inboard photovoltaic module.

Each of the outboard side rails of the outboard photovoltaic modules are preferably covered and protected by a removable, detachable, outboard (outer or outwardly-facing) row closure 216 (FIGS. 4 and 6). The outboard row closure can have a C-shaped or [-shaped (bracket shaped) cross-section 218 (FIG. 4) which is complementary to and matingly engages the outboard side rail. The outboard row closure can have: (a) an upper closure flange 220, (b) a lower closure flange 222, and (c) an intermediate closure bight 224. The outboard row closure and outboard side rails have substantially aligned bolt holes (mounting holes) 226–229 to receive hexagonal head stainless steel lag bolts 230 or other fasteners to securely connect and directly mount the photovoltaic modules to the roof or support structure. The upper and lower closure flanges can be parallel and extend laterally inwardly towards the outboard photovoltaic module. The intermediate closure bight provides a closure crossbar which extends between and integrally connects the upper and lower closure flanges. When assembled, the outboard row closure cooperates with the outboard side rail so that the closure crossbar is spaced apart from the side crossbar to provide a gap therebetween which defines an outboard (outer) side electrical raceway 232 (FIG. 4). The outboard side electrical raceway provides an outboard wire trough and outwardly facing slot to hold, support, enclose, conceal, and protect plugs (plug connectors) such as 234, wire such as 236, output interconnections (interconnect wires), such as 240 of a source circuit 242 (FIG. 10). The source circuit provides conductors between and from the photovoltaic modules to common connection points of the photovoltaic electrical system.

Figure 8:
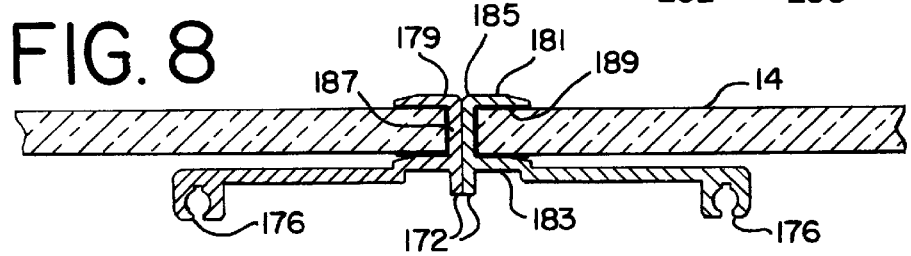
FIG. 8 is an enlarged cross-sectional view of abutting inboard ends rails (end caps) without electrical raceways, taken substantially along lines 8—8 of FIG. 5.

The row closure, end caps, and side rails can be formed of aluminum or other metal and can be painted, coated, anodized or otherwise treated or molded of plastic. The photovoltaic modules and frames can be installed and secured horizontally, vertically or at an angle of inclination as desired. The preferred orientation for the PV modules and frames would provide for them to have their open ends at top and bottom allowing convective cooling and drainage. However, the end caps and side rails can be placed up, down, left, or right, or at any other orientation, preferred by the installer or customer. In FIG. 1 the outboard end caps (outboard end rails) face outwardly (up and down). The inboard end caps (inner end rails) face inwardly and abut against each other as shown in FIG. 8. This orientation of outboard and inboard end caps is preferred to position the photovoltaic modules to allow access to photovoltaic module wiring during and after installation.

Ground clips 244 (FIGS. 4 and 6) provide a grounding connection and are preferably connected to the outboard row closures and outboard side rails, as well as to the overlapping side rails, of the frames to electrically connect the frames. The ground clips can be positioned in proximity to the overlapping side rails to cover and protect the plugs (plug connectors). The ground clips can have an L-shaped body 246 with an elongated leg 248 and a short transverse foot 250. A threaded stud 252 or other fastener can be connected to the foot. The threaded stud fits through ground clip-holes (stud holes) 254–257 (FIG. 6) in the outboard side rails, outboard row closures and overlapping side rails and is fastened to the outboard side rails, row closure and overlapping side rails with nut 258 (FIG. 4) and star lock washer 260. A ground (grounding) lug 262 (FIG. 6) can be fastened to an outboard row closure. A grounding wire or ground connector can be connected to the ground lug. The ground lug can be attached to the inside of the row closure when using the ground conductor. The ground lug can be attached to the outside of the row closure when using a separate bare ground wire.

The ground clips and raceways help allow for complete wiring of the photovoltaic electrical system. Advantageously, the photovoltaic electrical system provides for virtually complete concealment of wires and plug connectors, except for the desired access to the output wires.

Each of the photovoltaic modules can have two positive output wires and two negative output wires to allow for series and parallel connections. The photovoltaic modules can be connected in series to form a string of modules. If desired, some or all of the photovoltaic modules can be connected in parallel.

FIG. 11 illustrates a typical parallel connection such as at location 264 in FIG. 10. In the parallel connection of FIG. 11, the grey wires 266 and 268 of adjacent (adjoining and abutting) photovoltaic modules 123 and 109 are connected together with plug connectors (plugs) 270 and 272 and the red wires 274 and 276 of adjacent photovoltaic modules 123 and 109 are connected together with plug connectors (plugs) 278 and 280.

FIG. 12 illustrates a typical series connection such as at location 282 in FIG. 10. In the series connection of 12, the plug connector (plug) 284 of red lead wire 286 of a photovoltaic module 111 is connected to the plug connector (plug) 288 of the grey lead wire 290 of an adjacent photovoltaic module 112. Also, the plug connector (plug) 292 of the grey lead wire 294 of a photovoltaic module 111 is connected to the plug connector (plug) 298 of the neutral jumper cable (return wire or interconnect wire) 196 for the photovoltaic modules. The plug connector (plug) 300 of the red lead wire 302 of the other photovoltaic module 112 can be terminated, plugged or capped with a silicon filled plug connector 304, since it is not connected to another wire in a series connection.

FIG. 13 illustrates another typical parallel connection such as at location 306 in FIG. 10. In the parallel connection of FIG. 13, the grey wire 308 of a photovoltaic module 125 is connected to the grey wire 310 of an adjacent photovoltaic module 115 via plug connectors (plugs) 312 and 314. Also, the red wire 316 of a photovoltaic module 125 is connected to the red wire 318 of an adjacent photovoltaic module 115 via plug connectors (plugs) 320 and 322.

FIG. 14 illustrates another typical series connection such as at location 324 in FIG. 10. In the series connection of FIG. 14, the plug connector (plug) 326 of the grey lead wire 328 of a photovoltaic module 117 is connected to a plug connector (plug) 330 of the red lead wire 332 of an adjacent photovoltaic module 118. The unattached unconnected plug connector (plug) 334 of the red lead wire 336 of a photovoltaic module 117 can be terminated, capped or plugged with a silicone filled plug connector (plug) 338. Also, the unattached unconnected plug connector (plug) 340 of the grey lead wire 342 of the adjacent photovoltaic module 118 can be terminated, capped or plugged with silicone filled plug connector (plug) 344.

FIG. 15 illustrates a typical series connection at the left side of an array of photovoltaic modules, such as at location 346 in FIG. 10. In the series connection of FIG. 15, the plug connector (plug) 348 of the grey jumper (interconnect wire) 350 is connected to a plug connector (plug) 352 of the grey wire 354 of the upper left outboard (outer or outwardly-facing) photovoltaic module 123, while the plug connector (plug) 356 of the grey jumper (interconnect wire) 350 is connected to the plug connector (plug) 358 of the red wire 360 of the lower left outboard photovoltaic module 125. The unattached unconnected plug connector (plug) 362 of the red lead wire 364 of the upper left outboard photovoltaic module 123 can be terminated, capped or plugged with a silicone filled plug connector (plug) 366. Also, the unattached unconnected plug connector (plug) 368 of the grey lead wire 370 of the lower left outboard photovoltaic module 125 can be terminated, capped or plugged with a silicone filled plug connector (plug) 372.

FIG. 16 illustrates a typical photovoltaic array output connection at the right side of an array of photovoltaic modules, such as at location 374 of FIG. 10. In the series connection of FIG. 16, the male plug connectors (plug) 376 of the red jumper (interconnect wire) 240 is connected to the plug connector (plug) 378 of the red lead wire 380 of the upper right outboard (outer or outwardly-facing) photovoltaic module 124. The red jumper 240 provides a positive output. The red jumper can have a plug connector (plug) 382, which can be removed or trimmed off before the red jumper is connected to a wire nut and output cable (wire). The plug connector (plug) 384 of the grey jumper (interconnect wire) 386 is connected to the plug connector (plug) 388 of the grey lead wire 390 of the lower right outboard (outer or outwardly-facing) photovoltaic module 126. The grey jumper 386 provides a negative output. The grey jumper 386 can have a plug connector (plug) 389 which can be removed or trimmed off before the grey jumper is connected to a wire nut and output cable (wire). Outboard jumper (outer interconnect wire) 390 provides a neutral output. The neutral outboard jumper 390 can have a plug connector (plug) 392 which can be removed or trimmed off before the neutral jumper is connected to a wire nut and output cable (wire). The unattached unconnected plug connector (plug) 394 of the grey lead wire 396 of the upper right outboard photovoltaic module can be terminated, capped or plugged with a silicone filled plug connector (plug) 398. Also, the unattached unconnected plug connector (plug) 399 of the red lead wire 238 of the lower right outboard photovoltaic module 126 can be terminated, capped or plugged with a silicone filled plug connector (plug) 234.

The electrical plugs (plug connectors) can have a socket to receive the wire (cables) of the photovoltaic electrical system. Discrete wire seals can be flush with the output ends of the plugs and receptacles. The wires can comprise tin with tin lead solder, or can comprise copper, or other electrically conductive metal. The wires can be insulated with silicone or other insulation.

The photovoltaic modules produce direct current (DC). The modules can be used in single module systems and multiple module systems to meet the current and voltage requirements for a wide range of applications.

Desirably, the overlapping side rails allow sharing of the lag bolts and provide for a stronger more compact framing system. The multi-purpose frames of the photovoltaic module framing system mechanically hold, support, and directly mount the modules on a surface or other structure, as well as provide electrical raceways which form an integral and significant part of the photovoltaic electrical system. The frames of the framing system can also be directly connected, linked, hooked, assembled, and/or installed on a roof without the use of a separate bracket or beam or the need to previously assemble, link or connect the frames together on the ground, as in conventional systems, or at another installation site, before lifting and attaching the framing system to the roof.

In order to install the photovoltaic module framing system and modules, the roof can be measured and a chalk line can be marked for the bottom row. Butyl tape or other sealant (seals) can be applied to the bottoms of the modules over the bolt holes (mounting holes). The first module can be positioned and aligned with the longitudinal axis oriented vertically in a portrait mode. The second module can be placed next to the first module so that the side rails overlap and the bolt holes are aligned. Afterwards, the first and second modules can be attached and fastened to each other and the first and second modules can be secured to the roof surface with lag bolts and washers through the bolt holes in the overlapping side rails. These steps can be repeated for the other modules. The wires to the modules and source circuit can be connected in series or parallel as desired using plugs (plug connectors). For series connections, blank plugs or other termination closures can be used to close unused connectors. The series connection can also have a neutral return jumper and a series jumper which are installed in a raceway or wire slot. The output jumpers can be cut, stripped and tested. The positive, negative, and neutral output conductors can be connected as described. Thereafter, the outboard row closures can be installed and fastened to the outboard side rails to cover, protect, and conceal the plugs, wires, and output interconnections, while permitting access to the output wires. The ground clips can be connected to the framing system with ground clip nuts and star washers. A hole can be punched in the frame to receive a sunlight resistant UF cable. The cable can held by a clamp and stripped and the ground conductor can be installed. The output wires can be connected to an inverter to convert DC from the photovoltaic array to alternating current (AC), such as used in many homes. The inverter preferably has less than 5% harmonic distortion and provides automatic disconnect from the utility grid when utility power is lost.

EXAMPLE

A photovoltaic module framing system was built, assembled and installed as described above. The photovoltaic (PV) modules comprised monolithic tandem junction amorphous silicon thin film solar cells on glass. The laminated glass was 6.5 mm. The framing system was connected to the roof. The framing system was installed directly on an asphalt shingle roof, into the plywood roof sheeting. The roof faced south, ie. the roof had a southern exposure. The PV array had a height of about 8 feet. The length of the PV array ranged from 40–68 feet.

The PV array converted solar energy in sunlight to 120 volts DC. The PV array had a nominal power of 1.2–2 kW AC. A 2.2 kW inverter with a peak efficiency of 91.4% converted the DC to 120 volts AC at 60 Hz. Because the system was connected to the utility grid, electricity could be drawn from the local utility when more electricity was needed. Conversely, current could be fed to the grid when the PV system was producing more electricity than was needed. The photovoltaic module framing system produced unexpected good results. The photovoltaic module frame system was attractive, concealed and protected most wires, and was easier and faster to install than conventional module framing systems.

Figure 17:
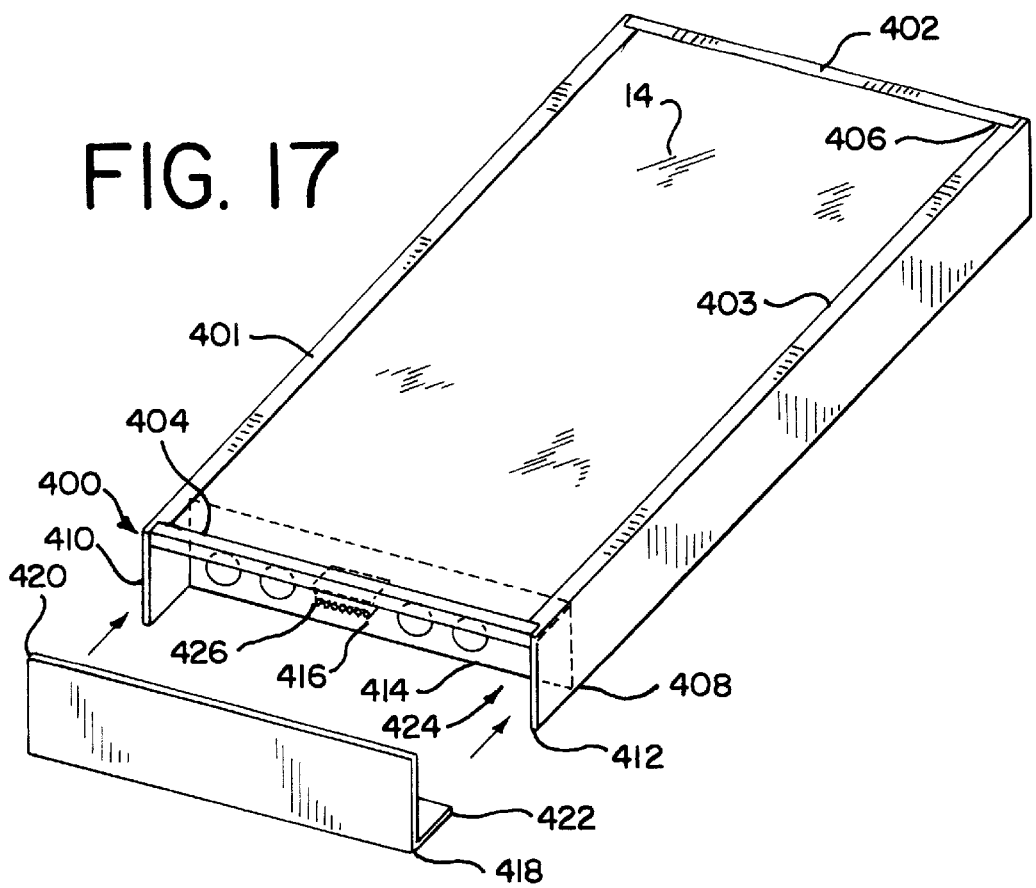
FIG. 17 is an exploded assembly view of a terminal block enclosure of another photovoltaic module framing system in accordance with principles of the present invention.

The multi-purpose module framing system can also have at least one terminal block-enclosure 400 as shown in FIG. 17. The terminal block-enclosure can have inwardly extending (inboard) upper and lower substrate-gripping flanges 401–404 which cooperate with each other to define a substrate-receiving channel 406, that receives a seal made of butyl rubber or other flexible or resilient fluid impermeable or water-impervious material, to hold, support, elevate and grip the side edges of the substrate 14, e.g. a glass plate, of the laminate.

The terminal-block enclosure 400 (FIG. 17) provides a terminal housing 408 with side flanges 410 and 412 that can provide breakaway ends and can have and an intermediate flange 414 which extends between and connects the side flanges. The terminal block-enclosure has a cavity 416 which provides a recess, opening, and compartment. A removable L-shaped terminal cover 418 can enclose, cover and protect the terminal housing. The L-shaped terminal cover has an elongated upright flange 420 which can be at right angles and perpendicular to a shorter lower flange 422. The terminal cover and housing cooperate with each other to define an electrical terminal block-enclosing raceway 424 therebetween into which a terminal block 426 is mounted or otherwise secured.

Figure 18:
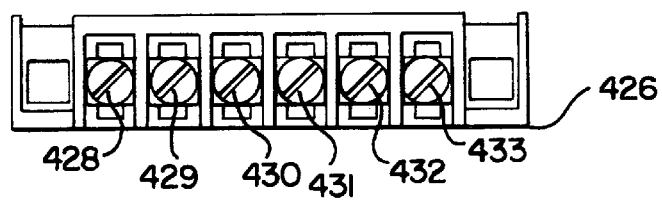
FIG. 18 is a front view of a terminal block.
Figure 19:
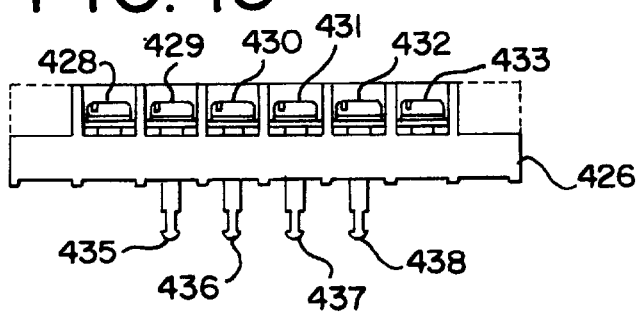
FIG. 19 is a top view of the terminal block.
Figure 20:
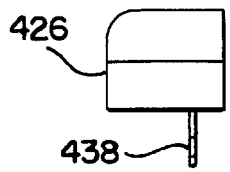
FIG. 20 is a side view of the terminal block.

The terminal block 426 (FIGS. 18–20) can have six #8–32 wire clamping screws 428–433 and four solder turret terminals 435–438. The unattached unconnected end clamping screws can provide non-feedthrough neutral terminals 428 and 433. The clamping screws can be connected to the output wires of the photovoltaic modules. The four solder turret terminals can be connected to the solar cells, such as being soldered to bus strips in the laminates of the photovoltaic modules.

Figure 21:
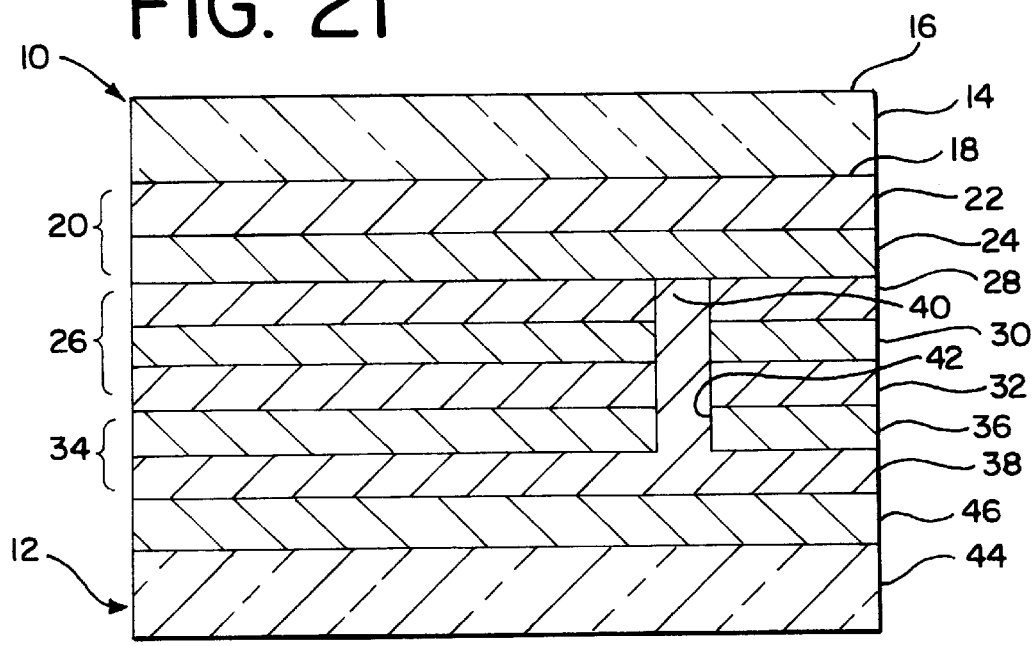
FIG. 21 is a cross-sectional view of a monolithic single-junction solar cell in accordance with principles of the present invention.

The monolithic photovoltaic (PV) module 10 of FIG. 21 provides a photovoltaic device which comprises a single junction solar cell 12. The solar cell has a generally planar or flat, light transmissive vitreous substrate 14 made of opaque glass, translucent glass, or most preferably, transparent glass, which provides the front glass of the photovoltaic module. The substrate has an external outer (outside) surface 16 and an inwardly facing inner surface 18. The substrate comprises a sodium-containing glass, such as soda-lime glass.

A dual layer front contact 20 (FIG. 21) can be disposed, deposited, positioned and lies upon the substrate. The dual layer front contact can comprise a dielectric outer front layer 22 comprising silicon dioxide positioned upon and abutting against the inner surface of the substrate and transparent metallic conductive oxide (TCO) inner back (rear) layer 24 also referred to as a CTO layer or coating, which provides a wide band gap front semiconductor, positioned upon, adjacent and abutting against the dielectric layer. The dielectric layer and the TCO layer can be deposited by low pressure chemical vapor deposition (LP CVD), or other methods. The TCO layer comprises a transparent metallic oxide, such as indium-tin-oxide, zinc oxide, cadmium stannate, or preferably tin oxide having a thickness less than 10,000 Å.

An amorphous silicon-containing thin film semiconductor 26 (FIG. 21) provides a single junction solar cell. The amorphous silicon semiconductor solar cell comprises a p-i-n or preferably an n-i-p amorphous silicon thin film semiconductor with a bandgap ranging from about 1.4 eV to 1.75 eV, usually to 1.6 eV. The amorphous silicon semiconductor or segment can comprise: hydrogenated amorphous silicon, hydrogenated amorphous silicon carbon or hydrogenated amorphous silicon germanium. The positively doped (p-doped) amorphous silicon p-layer 28 of the amorphous silicon semiconductor is positioned, disposed and deposited on, covers, lies upon, and is connected to the TCO layer of the front contact. The p-layer can be positively doped with diborane ($B_2H_6$), $BF_3$ or other boron-containing compounds. An amorphous silicon, undoped, active intrinsic i-layer 30 is deposited upon, positioned between and connected to the p-layer and a negatively doped (n-doped) amorphous silicon n-layer 32. The n-layer is positioned on the i-layer and can comprise amorphous silicon carbon or amorphous silicon negatively doped with phosphine ($PH_3$) or some other phosphorous-containing compound.

Amorphous silicon can be doped by adding impurities to the silane. For example, the first dopant may be diborane ($B_2H_6$), which is added to the silane to form a p-type amorphous silicon layer. After the p-type layer has been formed to a thickness on the order of 100 Angstroms (Å), preferably less than 150 Å, the diborane flow is stopped to form an intrinsic region having a thickness on the order of a few 1000 Angstroms, preferably 2500–4500 Å. Thereafter, an n-type dopant, such as phosphine ($PH_3$), is added to the silane flow in order to form an n-type amorphous silicon layer having a thickness of a few 100 Angstroms, preferably less than 150 Å. The p-i interface can be amorphous silicon carbon containing perhaps 5% carbon at the edge of the p-layer. The composition is then linearly graded until it contains no carbon at the i-layer edge. However, there are many ways to make a p-i interface, not all of which involve grading or using carbon.

A dual layer rear contact (back contact) contact 34 (FIG. 21) is deposited and positioned upon and connected to the amorphous silicon n-layer of the solar cell. The inner metallic front layer 36 of the rear contact can comprise a transparent metallic conductive oxide, such as tin oxide (TCO or CTO) comprising a wide gap rear (back) semiconductor, such as tin oxide, indium-tin-oxide, cadmium stannate, and preferably zinc oxide. The outer metallic rear (back) layer 38 of the rear contact can comprise a metal, such as silver, molybdenum, platinum, steel, iron, niobium, titanium, chromium, bismuth, antimony, or preferably aluminum. The TCO inner layer can be deposited by low pressure chemical vapor deposition (LP CVD), spray coating or other methods. The outer metallic layer can be deposited by sputtering or other methods.

An interconnect 40 (FIG. 21) provides a strong mechanical connection and an electrical contact between the tin-oxide inner TCO layer of the front contact and the aluminum outer layer of the rear contact. The interconnect preferably is integral with and comprises the same metal as the outer layer of the rear contact. In the preferred embodiment, the interconnect is aluminum. The interconnect extends through a trench (hole) 42 in the semiconductor and the zinc oxide inner layer of the rear contact. The trench can be formed and scribed simultaneously with a laser through the amorphous silicon containing semiconductor and zinc oxide inner layer of the rear contact. The interconnect preferably fills the trench and connects the tin oxide inner TCO layer of the front contact and the aluminum outer layer of the rear contact.

A transparent vitreous superstrate 44 (FIG. 21) comprising sodium-containing glass, such as soda-lime glass, is placed and positioned upon the front contact of the photovoltaic module and device. The photovoltaic module can be encapsulated with an encapsulating material (encapsulant) 46, such as ethylene vinyl acetate (EVA), to help protect the photovoltaic module from the environment. Other encapsulants can be used with or in place of the EVA, such as: Tedlar type plastic, Nuvasil type plastic, Tefzel type plastic, ultraviolet (UV) curable coatings, etc. and combinations thereof. The photovoltaic module can be unframed or can be partially or fully framed, supported or secured by a metal support comprising a metal member, such as a metal mounting structure, metal struts, or preferably a metal frame.

Figure 22:
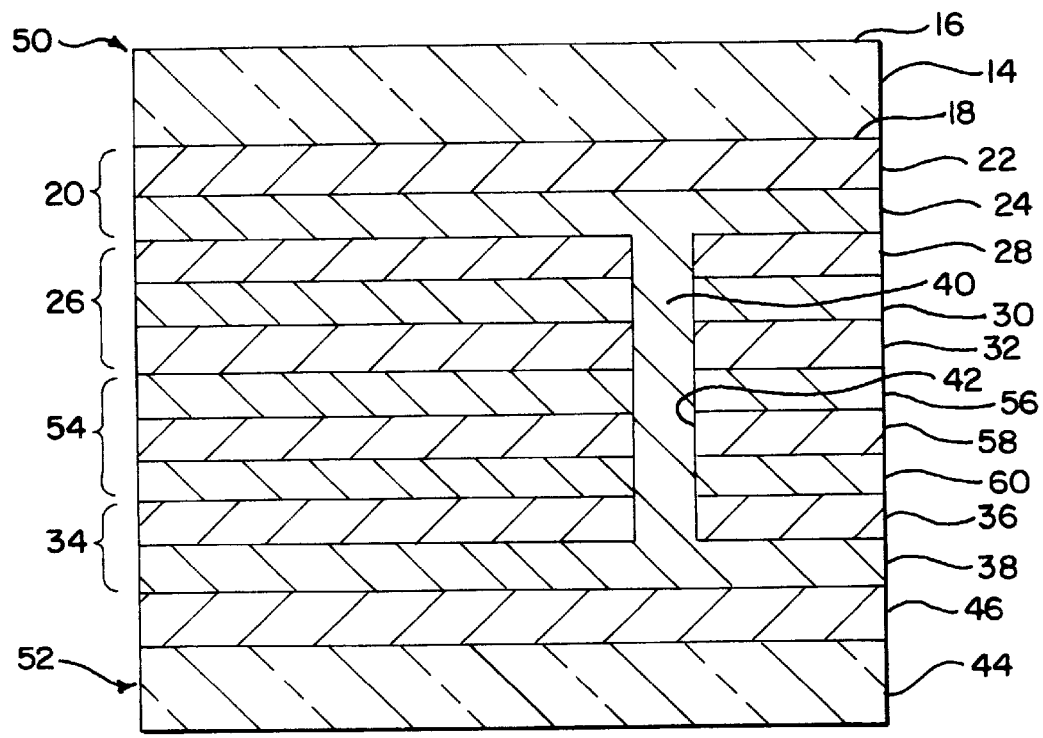
FIG. 22 is a cross-sectional view of a monolithic tandem junction solar cell in accordance with principles of the present invention.

The monolithic module 50 of FIG. 22 provides a photovoltaic device which comprises a tandem dual (multi) junction solar cell 52. The dual junction solar cell of FIG. 22 is generally structurally, physically and functionally similar to the single junction solar cell of FIG. 21, except as explained below. For ease of understanding, similar components and parts of the solar cells of FIGS. 21 and 22 have been given similar part numbers, such as substrate 14, front contact 20 with outer dielectric layer 22 and inner TCO layer 24, amorphous silicon-containing thin film semiconductor 26 which provides front solar cell or segment, dual layer rear contact (back contact) 34 with a TCO inner metallic layer 36 and an outer metallic layer 38, interconnect 40, trench 42, superstrate 44, EVA 46, etc. The n-i-p rear solar cell has n, i, and p-layers, which are arranged as previously explained.

The n, i, and p-layers of the rear cell are sometimes referred to as the $n_1$ $i_1$ and $p_1$-layers, respectively, of the rear cell. The front cell of the tandem junction solar cell can have a bandgap of 1.4 eV to 1.75 eV and preferably comprise hydrogenated amorphous silicon with a bandgap of 1.6 to 1.75. A rear (back) solar cell 54 comprising an amorphous silicon-containing thin film semiconductor is sandwiched and positioned between and operatively connected to the front cell and the rear (back) contact. The rear amorphous silicon cell can be similar to the front amorphous silicon cell described above. The front amorphous silicon cell or segment has a bandgap of about 1.4 eV to 1.75 eV, usually to 1.6 eV and preferably comprises hydrogenated amorphous silicon germanium with a bandgap of 1.4 eV. The amorphous silicon positively doped $p_2$-layer 56 of the rear cell is positioned disposed and deposited on, cover, lies and is the amorphous silicon negatively doped $n_1$-layer 32 of the front cell. The amorphous silicon intrinsic $i_2$-layer 58 of the rear cell is deposited upon, sandwiched, positioned between and connected to the $n_2$-layer 60 and $p_2$-layer of the rear cell.

In multi-junction (multiple junction) solar cells, such as the tandem junction solar cells of FIG. 22, the i-layers of the amorphous silicon containing cells can comprise an active hydrogenated compound, such as amorphous silicon, amorphous silicon carbon or amorphous silicon germanium. The active p-layers of the amorphous silicon-containing cells can comprise a p-doped hydrogenated compound, such as p-doped amorphous silicon, p-doped amorphous silicon carbon or p-doped amorphous silicon germanium. The active n-layers of the amorphous silicon-containing cells can comprise an n-doped hydrogenated compound, such as n-doped amorphous silicon, n-doped amorphous silicon carbon or n-doped amorphous silicon germanium.

In order to obtain better utilization of the solar spectrum and to improve stability, two or more p-i-n or n-i-p junctions with i-layer materials of different bandgaps can be built in series to form a monolithic multi-junction solar cell. The interface between the two amorphous silicon junctions, often called the tunnel junction or recombination junction, can also be a microcrystalline tunnel junction.

The use of microcrystalline silicon in the doped layers of the recombination junction can offer many advantages: (1) the higher carrier density generally available in microcrystalline versus amorphous silicon more easily supports the high electric fields required while using very thin layers; (2) more efficient recombination occurs due to the smaller mobility gap and the increased doping density, as well as to increased tunneling in the very thin layers; and (3) the optical absorption loss due to the tunnel junction layers can be reduced because of the lower absorption coefficient of microcrystalline silicon ($\mu$c-Si) in the visible wavelengths as well as because of the use of thinner layers. The high doping density and high electric field associated with the use of microcrystalline silicon ($\mu$c-Si) can improve open circuit voltage ($V_{oc}$). More efficient recombination in the tunnel junction will minimize charge accumulation near that junction. Furthermore, the short circuit current of the tandem device may be increased by use of microcrystalline tunnel junction layers.

The monolithic photovoltaic module 60 of FIG. 23 provides a photovoltaic device which comprises a triple junction solar cell. The triple junction solar cell of FIG. 23 is generally structurally, physically and functionally similar to the tandem junction solar cell of FIG. 22, except as explained below. For ease of understanding, similar components and parts of the solar cells of FIGS. 22 and 23 have been given similar part numbers, such as substrate 14, front contact 20 with outer dielectric layer 22 and inner TCO layer 24, an n-i-p front solar cell, semiconductor, or segment 20 with an $n_1$-layer 28, $i_1$-layer 30, and an $p_1$-layer 32, an n-i-p solar cell or semiconductor 54, which can provide an intermediate middle cell or segment for the triple junction solar cell, with a $n_2$-layer 56, an $i_2$-layer 58, and a $p_2$-layer 60, dual layer rear (back) contact 34 with inner TCO layer 36 and outer metallic layer 38, interconnect 40, trench 42, superstrate 44, EVA 46, etc. In the triple junction solar cell of the photovoltaic module for FIG. 23, the $p_2$-layer of the intermediate cell, can be positioned, above, deposited adjacent, cover, lie, and is connected to a back (rear) solar cell 64. While the back cell of FIG. 23 can be an amorphous silicon-containing cell, similar to the intermediate (middle) or front cell, it is preferred than the back cell comprise a polycrystalline cell, most preferably a thin polycrystalline silicon cell.

In some circumstances, it may be desirable to use a different arrangement of the triple junction solar cell, for example, it may be useful that the polycrystalline cell be the front cell, or that the amorphous silicon cell be the intermediate or rear cell, or that the amorphous silicon germanium cell be the rear cell or intermediate cell etc.

If desired, the front cell of the triple junction solar cell can comprise a copper indium polycrystalline semiconductor back or rear cell positioned on and connected to the rear contact on the substrate. The polycrystalline back cell or back segment can comprises a copper indium polycrystalline semiconductor with a bandgap ranging from 1 eV to 1.2 eV. The copper indium polycrystalline semiconductor can comprise copper indium diselenide (CIS) with a bandgap of 1 to 1.04 eV or copper indium gallium selenide (CIGS) with a bandgap of 1 to 1.2 eV. The CIGS semiconductor can have 0.1% to 24% by weight gallium. Generally, the greater the amount of gallium, the higher the bandgap. There are situations when CIGS is preferred over CIS and vice versa. CIS or CIGS can be is deposited by evaporation at a temperature ranging from 400° C. to 500° C.

An n-type (negative type) conductor or semiconductor 66 (FIG. 19) provides an n-doped (negative-doped) connector and tunnel junction which is sandwiched and positioned between and operatively connected to the polycrystalline back cell and the amorphous silicon intermediate middle cell. The n-type conductor can comprise a negatively doped (n-doped) amorphous silicon n-layer or cadmium sulfide. Cadmium sulfide (CdS) when used as the n-type conductor, can be deposited by sputtering, evaporation, or solution growth. Preferably, the n-type conductor comprises microcrystalline n-doped (negatively doped) amorphous silicon providing a microcrystalline n-layer ($\mu$n layer). The $\mu$n layer can have a thickness of about 50 Å to 120 Å, preferably 80 Å to 100 Å. The negatively doped, n-type conductor comprising microcrystalline negatively doped (n-doped) amorphous silicon, can be deposited by enhanced plasma chemical vapor deposition (EP CVD). The n-type conductor serves to couple, secure and connect the back cell to the front or middle cells (segments).

There are many advantages to the triple junction solar cells of FIG. 23. The first is light absorption. The different amorphous alloys absorb different parts of the solar spectrum. Amorphous silicon carbon (a-SiC) absorbs ultraviolet (UV) light efficiently while passing most visible and all infrared light. Amorphous silicon (a-Si) absorbs UV light (but not as efficiently as a-SiC), absorbs visible light efficiently, but does not absorb much infrared (IR) light. Amorphous silicon germanium (a-SiGe) absorbs IR efficiently and UV and visible light generally inefficiently.

Polycrystalline can absorb the remaining light in the range from 900 to 1400 nm. Another benefit of triple junction and other multi-junction solar cells is that each layer (junction) can have a different absorbing layer, so that virtually all wavelengths of light can be absorbed efficiently. A further benefit of multi-junction solar cells is that because the absorbing layers are tailored to the solar spectrum and absorb light efficiently, they can be thinner. Thinner layers are more stable with respect to the Staebler-Wronski effect.

In operation, sunlight or light from other sources, enters the top of the monolithic triple junction solar cell and passes through the transparent conductive oxide comprising the front contact. The light then passes through the amorphous silicon front cell. Much, if not most, of the light in the bandgap of 400 to 900 nanometers (nm) are captured, absorbed and converted to electricity by the amorphous silicon front cell. The light then passes through the amorphous silicon germanium middle cell. Most, if not all, of the remaining light in the bandgap of 400 to 900 nm are captured, absorbed and converted to electricity by the amorphous silicon germanium middle cell. The remaining light then passes through the polycrystalline back (rear) cell where much, if not most of the light in the bandgap over 900 nm and primarily 900–1400 nm, are captured, absorbed and converted to electricity. Any remaining light will be reflected back to the rear (back) cell for further conversion, by the shing and reflective aluminum of the bimetallic rear contact. The combination and interaction of the amorphous silicon-containing cells and the polycrystalline cell can achieve a higher overall conversion of solar energy and light to electricity. Because the polycrystalline back cell is interconnected to the amorphous silicon front cell, the polycrystalline back cell can have some impurities, voids, or deviations without substantially impairing the overall performance of the monolithic multi-junction solar cell.

The bandgap and characteristics of the polycrystalline back cell can be varied, fined tuned, and controlled by changing the amount of silicon or gallium in the polycrystalline back cell. A CIS back cell can have a bandgap of 1 to 1.04 eV. A CIGS back cell with 20–24% by weight gallium can have a bandgap as high as 1.2 eV. Decreasing the amount of gallium in the CIGS back cell can alter and control the bandgap of the back cell to any desired level between 1 and 1.2 eV.

The bandgap and characteristics of the thin film front cell and thin film middle cell can be varied, fine tuned and controlled by changing the composition or thickness of the amorphous silicon and by using different alloys, to attain the desired levels between 1.4 to 1.75 eV.

It is therefore, apparent that the resulting optical bandgap and electrical characteristics of the monolithic multi-junction solar cell can be varied, fine tuned and controlled, in the preceding manner, to achieve the desired electrical properties.

The amorphous silicon containing, thin film semiconductor cells are deposited by enhanced plasma chemical vapor deposition (EP CVD), such as at a temperature of about 180° C. to about 200° C. The $n_1$ and $n_2$ layers of the amorphous silicon-containing cells can be formed by enhanced plasma enhanced chemical vapor deposition with a n-type dopant, such as phosphine ($PH_3$) or other phosphorous-containing compounds. The $p_1$ and $p_2$ layers of the amorphous silicon-containing cells can be formed by enhanced plasma chemical vapor deposition with a p-type dopant, such as diborane ($B_2H_6$) $BF_3$, or other boron-containing compounds. Plasma enhanced chemical vapor deposition can comprise DC or RF glow discharge under the following conditions: a temperature of the substrate ranging from about 80° C. to about 300° C.; a pressure ranging from about 0.5 to about 5 Torr; and a power density ranging from about 50 to about 230 mW/cm$^2$.

The top layer of the polycrystalline back cell can be treated with a hydrogen plasma etch, preferably without silane, for a period of about 150 to about 750 seconds without damaging the optical and electrical properties of the polycrystalline cell. Thereafter, the hydrogen treated layer of the polycrystalline cell can be nucleated with a negatively doped hydrogen plasma and a silicon-containing feedstock to form a negatively doped, microcrystalline tunnel junction or microcrystalline recombination junction ($\mu$n) layer having a thickness of about 50 Å to about 120 Å, preferably about 80 Å to about 100 Å.

The microcrystalline tunnel junction layer can also comprise a composite microcrystalline tunnel junction or composite microcrystalline recombination junction layer. The composite microcrystalline tunnel junction layer can comprise a negatively doped microcrystalline tunnel junction ($\mu$n-type) layer and a positively doped microcrystalline tunnel junction ($\mu$p-type) layer. The negatively doped microcrystalline tunnel junction $\mu$n-layer can be disposed between the n layer of the amorphous silicon-containing cell and the positively doped microcrystalline tunnel junction $\mu$p-layer. The positively doped microcrystalline tunnel junction $\mu$p-layer can be disposed between the $\mu$n-layer and the p-layer of the polycrystalline cell. The tunnel junction can be doped with phosphine, such as at the following ratio: 10,000 hydrogen: 100 silane: 2 phosphine. The microcrystalline tunnel junction layer can also include a microcrystalline tunnel junction $\mu$p-layer comprising p-doped microcrystalline silicon. The p-layer can comprise p-doped amorphous silicon.

The surface of the amorphous silicon i-layer can be etched for a period of about 300 to about 500 seconds with a hydrogen plasma etchant. The n-type doped layer can be nucleated to form an n-type microcrystalline silicon layer having a thickness of about 80 Å to about 100 Å. A microcrystalline tunnel junction $\mu$p-layer can be formed by subjecting the microcrystalline tunnel junction $\mu$n-layer to a positively doped hydrogen plasma and a silicon-containing feedstock to form the microcrystalline tunnel junction $\mu$p-layer on the microcrystalline tunnel junction $\mu$n-layer. Hydrogen plasma etching provides a relatively fast nucleation period and a speedy induction time for microcrystalline growth. Surface treatment by plasma etching, such as hydrogen plasma deposition, provides uniformly etched and smooth surfaces without damaging the optical and electrical properties or detracting from the appearance of the photovoltaic device. It is believed that plasma etching does not crystallize the surface, but serves as a catalyst and promoter to enhance microcrystalline nucleation and growth.

At least one of the doped layers of the amorphous silicon-containing solar cells can also comprise a microcrystalline doped layer which is positioned adjacent to and abuts against the etched surface of the i-layer. Desirably, the microcrystalline doped layer has a thickness of about 50 Å to about 120 Å. The microcrystalline doped layer, microcrystalline tunnel junction layer or microcrystalline recombination junction layer should be thin, preferably 50–120 Å, and most preferably 80–100 Å to: (1) establish an electrical field inside the intrinsic i-layer, (2) increase reflection of light to the i-layer, and (3) minimize absorption. Preferably, the etched surface of the i-layer in the solar cell comprises a hydrogen etched surface without silane so as to promote nucleation of the subsequently deposited microcrystalline doped layer. The microcrystalline silicon (μc-Si) after etching can improve the conversion efficiency of the tandem amorphous silicon (a-Si:H) solar cell by more than 10%.

Tandem and other multi-junction solar cells are intrinsically more stable than single-junction photovoltaic devices with the same light absorbing capabilities. Multi-junction solar cells can have layers of hydrogenated amorphous silicon separated by a tunnel junction and arranged in a stacked configuration. The thickness of the layers can be adjusted to maximize efficiency and equalize the current generated in each layer. The multi-junction solar cells can have the bandgap of the amorphous silicon layers varied by adjusting the hydrogen concentration in the amorphous silicon layers.

The most significant measure of a solar cell is its conversion efficiency. The conversion efficiency is the percentage of the energy of the light impinging on the cell converted to electrical energy which can be used by an external load, e.g. light bulb.

The energy in sunlight (striking a flat surface at solar noon) is about 100 mW/cm$^2$. For convenience solar simulators are calibrated so that the energy that they radiate is as close as possible to 100 mW/cm$^2$. Therefore, the procedure is to measure how much energy is being produced by the cell when illuminated.

The output of a solar cell can be determined by: $V_{oc}$=open circuit voltage, $P_{max}$=maximum solar cell power and $J_{sc}$=short circuit current. The cell efficiency is determined by the maximum amount of power it can produce, which is the power at the maximum power point. While conversion efficiency can be defined as the ratio of energy produced to energy incident, it can also be defined in terms of power. The conversion efficiency of a solar cell can be determined as follows:

$$\text{Efficiency}(\%) = (P_{max} / P_{incident}) \times 100$$
$$= (P_{max} / 100) \times 100$$
$$= P_{max}$$
$$\text{Efficiency} = P_{max} = V_{max} \times J_{max}$$
$$= V_{oc} \times J_{sc} \times FF$$

$V_{oc}$=Open circuit voltage, i.e. the voltage developed by cell in situation where no current is drawn (cell is open circuited). If you measure the voltage across the terminals of your car battery with a voltmeter, you will be measuring the open circuit voltage (a little over 12V).

$J_{sc}$=Short circuit current, i.e. the current passed by cell if it is short circuited. If you drop a wrench across the terminals of your car battery, you will be passing the short circuit current (hundreds of amps) through the wrench. Short circuit currents on solar cells are much smaller and not nearly as dangerous.

$FF$=ratio of $P_{max}$ to $V_{oc} \times J_{sc}$

Efficiency is really given by: Efficiency=$(P_{max}/P_{incident}) \times 100$. However, in practice $P_{incident}$(power of light incident on cell) is set to 100 so that efficiency=$P_{max}$. Fill factor (FF) is a number used to express efficiency in terms of open circuit voltage ($V_{oc}$) and short circuit current ($J_{sc}$).

Alternative Feedstocks

While silane and hydrogen are the preferred feedstocks for amorphous silicon cells, there are many alternative feedstocks for undoped plasma-enhanced chemical vapor deposition (CVD) glow discharge a-Si:H and a-SiC:H alloys. The diluent hydrogen ($H_2$) can be replaced by deuterium (D), with the diluent gas being HD or $D_2$. The alternative feedstocks for silane ($SiH_4$), in addition to $SiH_4$ or instead of $SiH_4$, can be expressed by the following general formula: $Si_N H_{2N+2-M} Y_M$, where Si is silicon, H is hydrogen or deuterium, Y is a halogen, e.g. fluorine (F), chlorine (Cl), etc., N and M are positive integers under the constraint that $N \geq 1$ and $2N+2-M \geq 0$. The examples of the above expression include silane ($SiH_4$), N=1, M=0, disilane ($Si_2H_6$), N=2, M=0, $SiF_4$(N=1, M=4, Y=fluorine), $SiHF_3$ (N=1, M=3, Y=fluorine), $Si_2H_2Cl_4$(N=2, M=4, Y=chlorine), tetramethyl silane,etc. When the alternative Si feedstocks are used, the optimal or preferred deposition conditions may have to be adjusted.

For hydrogenated amorphous silicon carbon (a-SiC:H) deposition, the alternative carbon feedstocks are numerous indeed. In general, most typical hydrocarbons or hydrogen-halogen-carbon compounds can be used, e.g. $CH_4$, $C_2H_2$, $C_2H_4$, $C_2H_6$, $CF_4$, $C_3H_8$, $CDCl_3$. Other carbon feedstocks can be used which contain built-in carbon-silicon bonds, which can be expressed by the formula: $CH_N(SiH_3)_{4-N}$, where N is an integer in the range of 0 to 4, e.g. $CH_3SiH_3$ (methylsilane or silylmethane), $CH_3(SiH)_3$(trisilymethane). The H in the second compound ($SiH_3$) in the above formula can be replaced by a halogen, e.g. $CH(SiF_3)_3$. When an alternative carbon feedstock is used in addition to or in place of methane ($CH_4$), the deposition parameters such as $H_2$-dilution ratio and power density can be adjusted accordingly. In the process, deposition conditions of high pressure, low temperature and high diluent concentrations are used to attain stable solar cells with high open circuit voltages ($V_{oc}$) and high fill factors (FF).

The absence of significant amounts of carbon radicals in amorphous silicon carbon can enhance microcrystalline silicon formation as can very high $H_2$-dilution. The deposition process may be applied to a-Si:H or other materials deposition using enhanced plasma CVD. This process covers the direct and remote plasma-CVD deposition of any material under conditions similar to those described above. Deposition parameters such as power density or electrical bias may be varied, if desired. Increased hydrogen dilution can improve a-SiC:H wide-gap material. Hydrogen plasma etching can provide good surface coverage by the hydrogen during growth, so as to attain higher surface mobility of growth pre-cursers and a better chance of hydrogen compensation of defects in microcrystalline tunnel junctions. Hydrogen plasma etching can also provide more uniform growth and less ion bombardments at the growth surface.

Among the many advantages of the photovoltaic module framing system of the present invention are:

1. Superior multiple-purpose photovoltaic module framing systems.
2. Integration and combination of the photovoltaic module framing system with the photovoltaic electrical system.
3. Direct mounting on surfaces.
4. Excellent concealing and hiding of most exposed wires and plugs.
5. Ease of installation.
6. Simple to assemble.
7. Superb performance.
8. Provides better surface mounting systems.
9. Avoidance of supplemental brackets, braces and beams in the module framing system.

10. Avoids the need for junction boxes in the module framing system.
11. General photovoltaic module applications.
12. Easy access to output wires.
13. Aesthetically pleasing.
14. Allows for sharing of lag bolts.
15. User-friendly.
16. Convenient.
17. Sturdy.
18. Economical.
19. Dependable.
20. Effective.

Although embodiments of this invention have been shown and described, it is to be understood that various modifications, substitutions and rearrangements, of parts, components, and process steps, can be made by those skilled in the art without departing from the novel spirit and scope of this invention.

What is claimed is:

1. A photovoltaic module framing system, comprising:
an array of photovoltaic modules interconnected by electrical wires, each of said photovoltaic modules comprising a periphery and an electrical wire-enclosing assembly in the absence of an electrical junction box and flexible metal electrical conduits for supporting, enclosing and concealing a portion of electrical wires in said photovoltaic modules;
said electrical wire-enclosing assembly comprising a frame positioned about the periphery of said photovoltaic module for holding said photovoltaic module; and
said frame having a side rail defining an external partially enclosed electrical wire raceway for providing an access channel for holding said electrical wires interconnecting said photovoltaic modules; and
said frame having at least one end rail for receiving fasteners to directly mount said photovoltaic module on a roof, wall, rack or beam.

2. A photovoltaic module framing system in accordance with claim 1 wherein said frame has portions to space said photovoltaic module above a roof so as to form a gap therebetween for channeling water, said gap further providing an air passageway for cooling said module.

3. A photovoltaic module framing system in accordance with claim 1 wherein said frame defines a cavity for providing a compartment, a cover for enclosing said compartment, said cover and said compartment cooperating with each other to define a raceway, and a terminal block positioned in said raceway.

4. A photovoltaic module framing system in accordance with claim 1 wherein said frame comprises an outboard closure for covering said side rail, said closure and said side rail cooperating with each other to define an electrical raceway therebetween for enclosing, concealing and protecting plugs, wires and output interconnections.

5. A photovoltaic module framing system, comprising:
an array of photovoltaic modules interconnected by electrical wires;
each of said photovoltaic modules comprising
a laminate connected to said electrical wires, said laminate comprising
a substrate;
at least one solar cell comprising photovoltaic semiconductors;
an encapsulating material for at least partially encapsulating said substrate and said solar cell;
a mechanical frame for holding and directly mounting said laminate adjacent to a structure selected from the group consisting of a surface, roof, wall, rack, and beam; and
said mechanical frame defining an external partially enclosed electrical raceway for providing a channel to hold said electrical wires interconnecting said photovoltaic modules.

6. A photovoltaic module framing system in accordance with claim 5 wherein said frame further defines an internal electrical raceway.

7. A photovoltaic module framing system in accordance with claim 5 wherein said solar cell is selected from the group consisting of: a single junction solar cell, a tandem solar cell, a triple junction solar cell and a multiple junction solar cell.

8. A photovoltaic module framing system comprising;
an array of photovoltaic modules with overlapping side rails;
said overlapping side rails having overlapping flanges with aligned bolt holes for receiving lag bolts or other fasteners to securely connect and directly mount said photovoltaic modules above a roof in order to form an air gap between the roof and said photovoltaic modules for channeling rain and water and for passing air below said photovoltaic modules to dissipate heat emitted from said photovoltaic modules;
each photovoltaic module comprising
a laminate;
a mechanical frame for securely holding said laminate; and
electrical wires connected to said laminate;
said laminate comprising
a light-transmissive vitreous substrate selected from the group consisting of transparent glass and translucent glass, said light-transmissive vitreous substrate having a periphery;
at least one solar cell supported by said light-transmissive vitreous substrate; and
an encapsulating material at least partially encapsulating and sealing said light-transmissive vitreous substrate and said solar cell, said encapsulating material being selected from the group consisting of ethylene vinyl acetate and Tedlar-type plastic;
said mechanical frame comprising side rails and end rails providing end caps extending between and connected to said side rails, said end rails and said side rails cooperating with each other to form a frame with a groove for receiving said periphery of said light-transmissive vitreous substrate, and said side rails of said frame include at least one of said overlapping side rails;
said overlapping side rails defining a thermal expansion side raceway between adjacent photovoltaic modules for accommodating thermal expansion of said adjacent photovoltaic modules;
one of said end rails defining an internal electrical wire raceway for providing a inner channel to hold and conceal said electrical wires and defining an external partially enclosed electrical wire raceway for providing an accessible channel for holding wires extending across at least some of said photovoltaic modules;
said photovoltaic modules including at least two outboard modules; and
said mechanical frames of said outboard modules each having an outboard side rail positioned across from one of said overlapping side rails, and an outboard row closure for covering said outboard side rail, said outboard row closure and said outboard side rail cooperating with each other to define an outboard electrical raceway therebetween for substantially enclosing, concealing, and protecting plugs, wires, and output interconnections of a source circuit.

9. A photovoltaic module framing system in accordance with claim 8 wherein said photovoltaic modules include intermediate modules between said outboard modules.

10. A photovoltaic module framing system in accordance with claim 8 including a ground clip connecting to one of said frames for grounding said mechanical frames and covering plugs between some of said photovoltaic modules.

11. A photovoltaic module framing system in accordance with claim 8 where said overlapping side rails are selected from the group consisting of metal and plastic.

12. A photovoltaic module framing system in accordance with claim 8 wherein said outboard side rails and said overlapping side rails have an identical shape and size.

13. A photovoltaic module framing system in accordance with claim 8 wherein said solar cell comprises a crystalline wafer selected from the group consisting of silicon, CIGS, CIS, and gallium arsenide.

14. A photovoltaic module framing system in accordance with claim 8 wherein said solar cell comprises at least one thin film solar cell comprising a semiconductor selected from the group consisting of microcrystalline silicon, amorphous silicon, amorphous silicon carbon, amorphous silicon germanium, and cadmium telluride.

15. A photovoltaic module framing system in accordance with claim 8 wherein said solar cell comprises at east one thin film solar cell selected from the group consisting of an n-i-p solar cell and a p-i-n solar cell.

16. A photovoltaic module framing system in accordance with claim 8 wherein said photovoltaic modules comprise interconnected modules selected from the group consisting of series modules and parallel modules.

17. A photovoltaic module framing system in accordance with claim 8 including plug connectors for connecting said wires in said accessible outer channel, said plug connectors being accessible in said accessible channel after mechanical installation and assembly of said photovoltaic module framing system without disconnecting or disassembling said photovoltaic module framing system.

18. A photovoltaic module framing system in accordance with claim 8 wherein each module has two positive output wires and two negative output wires to allow for series and parallel connections.

19. A photovoltaic module framing system in accordance with claim 8 wherein said modules are placed and assembled together on a roof without previously assembling or connecting the modules together on the ground or at a work site.

\* \* \* \* \*

UNITED STATES PATENT AND TRADEMARK OFFICE
CERTIFICATE OF CORRECTION

PATENT NO. : 6,111,189
DATED : August 29, 2000
INVENTOR(S) : Paul Garvison, Donald B. Warfield It is certified that error appears in the above-identified patent and that said Letters Patent is hereby corrected as shown below:

Column 18,
Line 7, "$Si_N H_{2N=2-M} Y_M$," should read, "$Si_N H_{2N+2-M} Y_M$,"

Column 22,
Line 4, "comprises at east one" should read, "comprises at least one"
Line 15, "in said accessible channel" should read, "in said accessible outer channel"

Signed and Sealed this

Second Day of October, 2001

*Attest:*

NICHOLAS P. GODICI
*Attesting Officer*    Acting Director of the United States Patent and Trademark Office